United States Patent [19]

Crain et al.

[11] Patent Number: 5,311,443
[45] Date of Patent: May 10, 1994

[54] RULE BASED FLOORPLANNER

[75] Inventors: Steven L. Crain; Joseph J. Burkis, both of Chandler; Andrew H. Cowan, Gilbert; Martin F. Lutz, Mesa, all of Ariz.

[73] Assignee: Motorola Inc., Schaumburg, Ill.

[21] Appl. No.: 928,573

[22] Filed: Aug. 13, 1992

[51] Int. Cl.⁵ .............................................. G06F 15/00
[52] U.S. Cl. ..................................... 364/491; 364/488; 395/921
[58] Field of Search .............. 364/488, 489, 490, 578; 395/919, 920, 921, 922, 923

[56] References Cited

U.S. PATENT DOCUMENTS

| | | | |
|---|---|---|---|
| 4,495,559 | 1/1985 | Gelatt, Jr. et al. | 364/148 |
| 4,701,860 | 10/1987 | Mader | 364/490 |
| 4,815,003 | 3/1989 | Putatunda et al. | 364/491 |
| 4,918,614 | 4/1990 | Modarres et al. | 364/490 |
| 5,038,294 | 8/1991 | Arakawa et al. | 364/491 |
| 5,072,402 | 12/1991 | Ashtaputre et al. | 364/491 |
| 5,084,824 | 1/1992 | Lam et al. | 364/490 |
| 5,175,696 | 12/1992 | Hooper et al. | 364/489 |
| 5,191,542 | 3/1993 | Murofushi | 364/491 |
| 5,197,016 | 3/1993 | Sugimoto et al. | 364/490 |
| 5,204,939 | 4/1993 | Yamazaki et al. | 395/51 |

OTHER PUBLICATIONS

Ferry, "Interconnection Lengths and VLSI", IEEE Circuits and Devices, Jul. 1985, pp. 39–42.

Hamada et al., "An Efficient Multilevel Placement Technique Using Hierarchical Partitioning", IEEE Transactions on Circuits and Systems, Jun. 1992, pp. 432–439.

D. Ferry, "Interconnection Lengths and VLSI", IEEE Circuits and Devices Magazine, Jul. 1985.

Primary Examiner—Thomas G. Black
Assistant Examiner—Tan Q. Nguyen
Attorney, Agent, or Firm—Michael D. Bingham; Michael A. Waters

[57] ABSTRACT

A rule based floorplanner for a macrocell array having a plurality of predetermined macrocells. The floorplanner uses a net list (23), a macrocell list (26), and a list of design constraints (31) and characteristics of the base array itself to derive an initial Burain score. A trial floorplan is attempted (33) and checked against a list of theoretical rules (39) and a list of empirical rules (38) to determine a measured Burain score (36) which accurately indicates the difficulty which can be expected when completing the design.

11 Claims, 1 Drawing Sheet

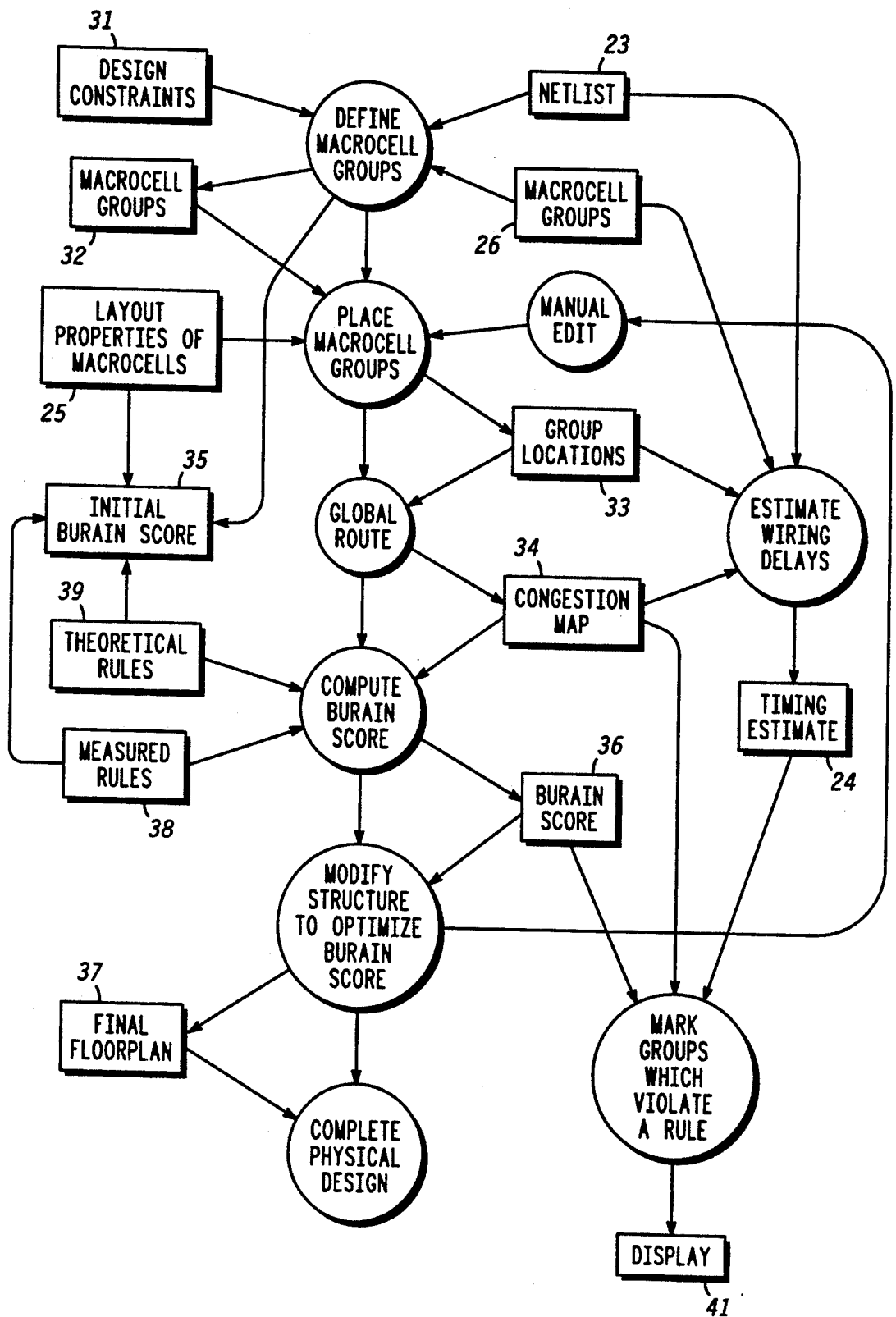

RULE BASED FLOORPLANNER

BACKGROUND OF THE INVENTION

The present invention relates, in general, to automated design of integrated circuits, and more particularly to floorplanning for an integrated circuit which utilizes a macrocell array structure.

During the physical design process of a large, structured integrated circuit a floorplanning step, i.e. the automatic placing of logic, memory and other elements on the integrated circuit, has proven to be highly useful. Not only is the probability of successfully completing the physical layout increased by such a preliminary step, but the computer time and manual effort taken to complete this step is also reduced. One such floorplanner is found in U.S. Pat. No. 4,918,614, issued Apr. 17, 1990, to H. Modarres et al., which is incorporated herein by reference. The floorplanner described by Modarres et al examines the connectivity net list in an attempt to first place groups of cells in the most advantageous position, then to assign connections to routing channels so as to best assure successful completion of routing. The floorplanner estimates the probability of success based on the routing wires balanced by the actual space that is estimated to be required for routing these connections. However, this estimate does not take into account enough of the many variables that affect the success of this highly complex physical design process.

There is a need for a floorplanner which provides a highly reliable estimate of the probability for success during the balance of the physical design process. The floorplanner should incorporate a graphical interface to allow manual editing of the floor plan, a fast global router to allow accurate determination of the wire length contribution for each connection, a graphical display which will accurately indicate the areas of congestion to the designer, and which will allow manual editing of the floorplanning process. Since the entire process of floorplanning, cell placement, and interconnect routing are highly complex the floorplanner must incorporate both theoretical and empirical rules which take into account the complex components affecting success of the physical design process. The floor planner should derive an initial suitability score for the design based on the netlist information that accurately predicts the difficulty expected when completing the physical design. The floorplanner must then allow the floorplan to be manually altered for optimization. A more accurate suitability score should be readily derived to guide this optimization. Finally the floorplanner should output files that can interact directly with other physical design tools allowing very accurate prediction of integrated circuit timing without spending the computer time and expense required to actually design and test the integrated circuit.

SUMMARY OF THE INVENTION

Briefly stated, there is provided a rule based floorplanner for a macrocell array having a plurality of predetermined macrocells. The floorplanner uses a net list and a macrocell list giving physical characteristics of each macrocell together with a list of design constraints for the design and the base array. A trial floorplan is attempted and checked against a list of theoretical rules and a list of empirical rules to determine a score that accurately indicates the difficulty which can be expected when completing the design. The trial floorplan is then modified and the evaluation repeated until an optimum floorplan is achieved.

BRIEF DESCRIPTION OF THE DRAWINGS

FIG. 1 shows a data flow diagram for a rule based floorplanner.

DETAILED DESCRIPTION OF THE DRAWINGS

Probability of success during placing and routing of an integrated circuit comprising an architecture of logic and/or memory cell element design can be represented as a function:

$$R = f(Q, P, F, B, W, Arc, Lib, PR, r)$$

Where:
R = Routability of the design
Q = Equivalent count of the cells used in a particular design.
P = Total connected pins.
F = Average fanout of nets.
B = Blockages that obstruct routing between pin pairs.
W = Average wire length of a connection.
Arc = Architecture of the Logic design.
Lib = Design of the Cell and library.
PR = Efficiency of the Place and Route software.
r = Rent coefficient.

The variable Lib and PR can be regarded as constants in calculations once they are characterized to a particular vendor. The architecture variable can also be accounted for by the rent coefficient in the well-known Rent's rule.

Rent's rule is:

$$IO = kP_oQ^r$$

Where
IO = Number I/O pins required by a logic block.
k = Proportionality constant.
$P_o$ = Average pins per logic gate.
Q = Number of equivalent gates.
r = Rent coefficient.

Rent made an empirical study and observed that the number of I/O (input/output) pins required for a logic block was related to the number of logic gates in the block. The Rent rule can also be applied to the average interconnection length of nets connecting the pins in a logic network.

Rent's rule represents a mathematically derived formula for the upper bound on expected average interconnection length for linear and square arrays of logic blocks. Rent's rule can be applied to approximate the wiring area requirement of a given logic block.

The wire length equation for average wire length:

$$L_w = \left( \frac{KP\left(\frac{2}{9}\right)[7(Q^{(r-0.5)}) - 1]}{4^{(r-0.5)} - 1} \right) - \left( \frac{1 - (Q^{(r-1.5)})}{1 - 4^{(r-1.5)}} \right)\left( \frac{1 - 4^{(r-1)}}{1 - (Q^{(r-1)})} \right)$$

Where:
- $L_w$ = Average wire length of a connection.
- P = Wiring pitch between the cells.
- K = Proportionality constant.
- Q = Number of logic gates used in the design.
- r = Rent coefficient.

For large values of Q and r > 0.5 the above equation will asymptotically reduce to a simpler form:

$$\lim_{Q \to \infty} (L_w) = KPQ^{(r-\frac{1}{2})}$$

For highly parallel circuit designs the Rent coefficient is generally found to be r = 0.65.
Therefore:

$$L_w = KPQ^{0.15} \quad (1)$$

For a square integrated circuit such as an HDCMOS macrocell array manufactured by Motorola:

$$L_w = AG_x = BG_y \quad (2)$$

Where:
- $L_w$ = Average wire length of a connection.
- A = Number of gates in the x-direction.
- B = Number of gates in the y-direction.
- $G_x$ = Gate x-size.
- $G_y$ = Gate y-size.

Also:

$$A \cdot B = Q \quad (3)$$

Substituting equations 2 and 3 gives:

$$B = A\left(\frac{G_y}{G_x}\right)$$

and:

$$A = \sqrt{\left(\frac{G_x}{G_y} Q\right)} \quad (4)$$

Next, to determine the average pitch of both x and y wiring connections combined, thus:
Total pitch length = $BG_xA + AG_yB$
Number of pitches = $BA + AB = 2AB$ and;

$$P_{av} = \frac{AB[G_x + G_y]}{2AB} = \frac{[G_x + G_y]}{2} \quad (5)$$

Where:
$P_{av}$ = Total wiring pitch length/Number of pitches.
This is a logical conclusion.
Representing the gate pitch in terms of $L_c$, Q and the ratio of gate sizes in the x and y directions:

$$G_y = \frac{L_c}{A} = \frac{L_c}{\sqrt{\left(\left(\frac{G_x}{G_y}\right)Q\right)}} \quad (6)$$

Where:
$L_c$ = Length of die on a side.

Now let $$\partial = \frac{G_x}{G_y}.$$

Substituting equation 6 into equation 5 and using $\partial$ results in:

$$P_{av} = \frac{(G_x + G_y)}{2} = \left[\frac{(1 + \partial)}{2\sqrt{\partial}}\right] L_c Q^{-0.5} \quad (7)$$

Finally, if we substitute equation 7 into equation 1 we arrive at the average wire length required for a square area of an integrated circuit with non square gates.

$$L_w = KP_{av}Q^{0.15} = \left[\frac{(1 + \partial)}{2\sqrt{\partial}}\right] KL_c Q^{-0.35} \quad (8)$$

Equation 8 gives the average wire length of a single connection between two pins.
The total wire length required to perform the interconnect of an entire circuit can be estimated using the equation:

$$T_{wl} = L_w Q P_o \left[\frac{F}{F+1}\right] \quad (9)$$

Where:
- $T_{wl}$ = Total wire length
- $L_w$ = Average length of a single connection.
- $P_o$ = Average Pin density (pins per gate) of used pins the total design.
- F = Average fanout of all nets in the total design.

Substituting equation 8 into equation 9 results in:

$$T_{wl} = \left[\frac{(1 + \partial)}{2\sqrt{\partial}}\right] KL_c Q^{0.65} P_o \left[\frac{F}{F+1}\right] \quad (10)$$

An alternative way to represent equation 9 is in terms of total used pins and nets, instead of fanout and pin density. The number of pin pairs in a design can be extracted from equation 9 to yield:

$$P_p = QP_o \left[\frac{F}{F+1}\right] \quad (11)$$

Where:
$P_p$ = Number of pin pairs in a design.
The average fanout F can be determined by counting the total used pins P in a design and dividing by the total number of nets N, minus 1; assuming a single source net. Multiple source nets can be assumed to have only one source and the other output pins are viewed as loads. This results in no loss of generality in this context.
Therefore:

$$F = \frac{P}{N} - 1 \quad (12)$$

Average pin density $P_o$ is equal to the total pins used divided by the total used gates.

$$P_o = \frac{P}{Q} \quad (13)$$

So:

$$P_p = \frac{Q\left(\frac{P}{Q}\right)\left[\frac{P}{N} - 1\right]}{\frac{P}{N} + 1 - 1}; \quad (14)$$

or $$P_p = P - N$$

The wiring connections in the previous equations were idealized two pin wires. In real nets shared segments are present however. Alternatively equation 14 can be derived, accounting for the shared segments with a scaling factor for each fanout. Total pin pairs then are:

$$P_p = \sum_{j=1}^{j=N} (P_j - 1) \quad (15)$$

Where:
j = index of the net.
$P_j$ = number of pins connected on net j.
N = total number of nets in the design.
Thus:

$$\begin{aligned}
P_p &= (P_1 - 1) + (P_2 - 1) + \ldots + (P_N - 1) \quad (16) \\
&= P_1 + P_2 + \ldots + P_N - N \\
&= \sum_{j=1}^{j=N} P_j - N \\
&= P - N
\end{aligned}$$

Equation 15 derived the total number of pin pairs one net at a time to arrive at the same result as equation 14. However, if we use the method of equation 15 we can add a scaling factor to each net to account for the shared wire segments and apply this result to the total wire length of a net. Thus:

$$\begin{aligned}
T_{wl} &= L_w P_p = L_w \sum_{j=1}^{j=N} (P_j - 1) \quad (17) \\
&= L_w [a(P_1 - 1) + b(P_2 - 1) + \ldots + d(P_N - 1)] \\
&= L_w [K_1 \Sigma(P_j, f=1 - 1) + K_2 \Sigma(P_j, f=2 - 1) + \ldots \\
&\quad + K_m \Sigma(P_j, f=m - 1)]
\end{aligned}$$

Equation 17 demonstrates how total wire length can be more accurately determined if the fanout of each net is known. Adding the total number of nets of a given fanout and multiplying by a scaling factor to account for the shared wire segments gives the total wiring space required to successfully connect the entire chip.

Scaling factors $K_i$ based on studies of actual designs are:

Fanout 1 → $K_1$ = 1.000
Fanout 2 → $K_2$ = 0.924
Fanout 3 → $K_3$ = 0.868
Fanout 4 → $K_4$ = 0.812
Fanout 5 → $K_5$ = 0.760
Fanout 6 → $K_6$ = 0.715
Fanout 7 → $K_7$ = 0.672

-continued
Fanout 8 → $K_8$ = 0.641
Fanout 9 → $K_9$ = 0.613
Fanout 10 → $K_{10}$ = 0.589
Fanout 11 → $K_{11}$ = 0.570
Fanout 12 → $K_{12}$ = 0.554

The total wiring space required for a specific design is related to the total routing space available. Consider a square die with $T_h$ and $T_v$ routing tracks in the horizontal and vertical directions respectively. For a three layer metal process with no poly routing we can assume that the wiring contribution on metal layer one will be relatively small for block to block routing. Furthermore, the metal layer one segments are very short. This is because fixed metal wiring of logic gates represents very limited access to long routing on metal layer one. These assumptions have been confirmed based on studies of CMOS, sea of gates, gate arrays manufactured by Motorola. Although the total wire length of metal layer one routes is certainly not negligible, we can consider the metal layer one routing contribution to simply be an extension of the metal layers two and three routing resource.

If the die is square and the routing track pitch is the same for both horizontal and vertical wiring, then:

$$\text{Wire length available} = L_c[T_h + T_v] = T_t L_c \quad (18)$$

Where:
$L_c$ = Length of die on a side.
$T_h$ = Number of horizontal tracks.
$T_v$ = Number of vertical tracks.
$T_t$ = Total tracks on the die.

If we equate equation 18 to equation 9, and use the results of equations 10 through 15 we get:

$$\begin{aligned}
T_{req} &= \left[\frac{(1 + \partial)}{2\sqrt{\partial}}\right] K Q^{0.65} P_o \left[\frac{F}{F + 1}\right] \quad (19) \\
&= \left[\frac{(1 + \partial)}{2\sqrt{\partial}}\right] K Q^{(-0.35)} [P - N]
\end{aligned}$$

Where:
$T_{req}$ = tracks required by logic in the netlist.

Generally, for HDCMOS and H4C gate arrays which are manufactured by Motorola, $\partial = 2.5$. The final value of total track requirement for a CMOS gate array has been found to be:

$$T_{req} = 1.73 Q^{(-0.35)} [P - N] \quad (20)$$

Experience has shown that routing of the die becomes very difficult as the track utilization exceeds 52.5%. Typically a track utilization above 67% cannot be completely routed.

Equation 20 was derived making many assumptions. One implicit assumption is routing on the tracks was unobstructed. In actual circuit libraries many logic blocks will utilize metal layer two and metal layer three resources for fixed wiring. In addition when metal layer three needs to connect to a pin of a macro, it needs to drop vias to the layers below. The same holds for metal layer two vias to metal layer one and so on. The vias and power grid routing will present additional obstructions. Each time an obstruction to normal interconnect routing is encountered there will be a corresponding addition to the effective track required to successfully route the deign. The obstructions can be accounted for by adding obstruction contribution to total tracks required.

$$T_{eff} = T_{req} + B_f + B_p + B_{pow} \qquad (21)$$

Where:

$T_{eff}$=Effective tracks required for routing.
$T_{req}$=Total tracks required for pin to pin connections.
$B_f$=Blockages of Fixed wiring.
$B_p$=Blockage of vias for pin connections.
$B_{pow}$=Blockage from power grid routing.

The blockage contribution of fixed metal wiring can be determined by analyzing the circuit library and the number of times each library element is used in the design of an integrated circuit. Pin blockages can be determined also with knowledge of the total pin connections in the design. Power grid routing is determined by the physical design of the base array. When blockage contribution and the coefficient K of equation 19 is curve fitted to an empirical database of designs produced with a particular CAD design system and circuit family, it becomes possible to determine the probability of a successful route. Thus when theoretical equations are fitted to an empirical database it is possible to determine, in advance, the probability of a successful route by extracting key parameters from the net list that defines the design.

A quantity known as a "Burain factor" is calculated to reflect this probability of routing success. The Burain factor is calculated as follows:

$$BF = 100 \left( \frac{T_{eff}}{T_t} \right) \qquad (22)$$

Where:

BF=Burain factor.
$T_{eff}$=Effective tracks for routing.
$T_t$=Total wire length.

FIG. 1 shows a data flow diagram of a rule based floorplanner that is a preferred embodiment according to the present invention. The electrical structure of the integrated circuit being designed is defined by a net list 23 and a macrocell list 26. Macrocell list 26 is a list of the pre-designed macrocells that may be used for the design on this macrocell array. Net list 23 comprises references to macrocells in macrocell list 26 together with instructions for connection between the ports of each macrocell so as to define the logical function of the integrated circuit being designed. An initial Burain score 35 is calculated using equation 22. In the preferred embodiment, the data for equation 22 that is unique to the particular design is derived entirely from net list 23. Equation 22 combines information that is unique to a particular design with knowledge of the base array as expressed in theoretical rules 39, measured rules 38, layout properties of macrocells 25 and macrocell list 26. On the basis of previous experience with routing of similar arrays, an evaluation of routing difficulty is derived from the Burain score. A design having a Burain score between 0 and 39 can be routed without problem. A Burain score between 40 and 49 indicates a chance that there may be moderate difficulty, 50 to 59 indicates moderate difficulty, 60 to 69 indicates extreme difficulty, and a Burain score over 70 cannot be routed.

A list of design constraints 31 includes time constraints to be placed on the performance of the design defined by net list 23. For example, one design constraint 31 may define a maximum delay for a specific signal path within the design. Based on the hierarchical structure of net list 23, macrocell list 26 and on design constraints 31, a plurality of macrocell groups 32 is defined. Each macrocell group 32 comprises macrocells which are grouped together as a unit. Typically macrocell groups 32 are arranged to so that each group of macrocells has an unusually high connectivity within the group, but groups are also formed based on macrocells which have critical timing requirements or unusually large physical dimensions. A large predesigned block such as a RAM may also be defined as one macrocell group 32.

A plurality of given macrocell physical properties 25 gives the size for each macrocell, the location of each pin of the macrocell, and any routing blockages within the macrocell. This information together with macrocell groups 32 can be used to make a preliminary architectural floorplan for the macrocell array by formulating a location within the macrocell array for each group within the macrocell groups 32. Macrocell groups 32 are located at a plurality of group locations 33 within the macrocell array. Group locations 33 are chosen to satisfy design constraints 31 with minimum wiring length between macrocell groups 32. In the preferred embodiment, critical nets such as clocks are routed before any other routing. A physical clock tree routing is derived based on optimal clock skew and delay for critical clock signals for a given design. A global routing process uses the information from group locations 33 to assign individual connections from net list 23 to specific routing channels, formed in areas known to be free of routing blockages. This produces a congestion map 34 that comprises a list of estimated usage compared with estimated capacity for each routing channel.

A plurality of known theoretical rules 39 together with a plurality of measured rules 38 is applied to congestion map 34 and group locations 33 to compute a Burain score 36. Theoretical rules 39 and measured rules 38 include rules and constraints embodied in equation 22. In addition theoretical rules 39 and measured rules 38 include rules for constraints such as maximum fanout for a signal and maximum wire lengths for critical signals. Compilations of parameters which affect theoretical rules 39 and measured rules 38 such as congestion map 34 and group locations 33 are displayed on a display 41. Typically the display of parameters such as congestion map 34 use mechanisms such as variation of color and image density to show the value being examined. For example a red area can show the parts of congestion map 34 which are extremely congested, yellow for moderate congestion and green for relatively uncongested areas.

Congestion map 34, group locations 33, and net list 23 are used to estimate wiring delays based on the floorplan. The estimate of wiring delays is then used to compute an accurate timing estimate 24, which includes the effect of wiring related delays. Design constraints 31, theoretical rules 39, and measured rules 38 are checked to ensure that each macrocell group complies with all constraints. Macrocell groups which violate one or more constraints are marked by displaying a graphical symbol such as an "X" over the area occupied by the macrocell group on display 41. Theoretical rules 39 together with measured rules 38 and given macrocell physical properties 21 are applied to congestion map 34 and group locations 33 to compute a Burain score 36.

If Burain score 36 proves to be undesirably high then the structure is modified to optimize Burain score 36. In the preferred embodiment an editing means such as one of the well-known computer driven graphical editors are used to modify the floorplan. The composition of the macrocell groups may be changed or the groups themselves can be manually placed in new locations. Analysis of the floorplan is repeated using theoretical rules 39, measured rules 38, and a revised congestion map 34. Rule violations are marked as before. Another Burain score 36 is calculated based on the new floorplan. When Burain score 36 is satisfactory, a final floorplan 37 is output based on the optimal group locations 33. Final floorplan 37 is used to complete the physical design of the integrated circuit.

The floorplanner provides a highly reliable estimate of the probability for success during the balance of the physical design process. The floorplanner incorporates a graphical interface to allow manual editing of the floor plan, a fast global router to allow accurate determination of the wire length contribution for each connection, a graphical display which will accurately indicate the areas of congestion to the designer, and allows manual editing of the floorplanning process. Since the entire process of floorplanning, cell placement, and interconnect routing are highly complex the floorplanner incorporates both theoretical and empirical rules. This combination of rules takes into account the complex components which affect success of the physical design process. The floorplanner derives a Burain score for the design which accurately predicts the difficulty to be expected when completing the physical design based on a floorplan. The floorplanner then allows the floorplan to be manually altered, optimizing the Burain score. Finally the floorplanner outputs files which can interact directly with other physical design tools. This direct connection allows very accurate prediction of integrated circuit timing without spending the computer time and expense required to actually design and test the integrated circuit.

Providing reliable estimates for success at each stage of the floorplanning process reduces the cost of floorplanning and produces a final floorplan which is better suited the subsequent design steps. Deriving an accurate estimate as a first step simplifies correction of logic designs for which physical design may be unduly difficult.

We claim:

1. A rule based floorplanner, comprising:
   a net list defining a plurality of desired connections between the macrocells;
   a plurality of macrocell groups defined among the plurality of predetermined macrocells, the macrocell groups being located within the macrocell array so as to satisfy a set of predetermined design constrains which constrain later placement of the macrocells;
   a theoretical rule for predicting routability of the macrocell array;
   a measured rule for predicting routability of the macrocell array; and
   a Burain score for the macrocell array based on the macrocell groups, the theoretical rule, and the measured rule applied to the macrocell groups as placed within the macrocell array.

2. The rule based floorplanner of claim 1 further comprising:
   an initial Burain score, wherein a plurality of components of the measured rule which are unique to the particular design are derived entirely from the net list.

3. The rule based floorplanner of claim 1 further comprising:
   a graphical indicator used to mark each macrocell group which is in violation of a predetermined constraint.

4. The rule based floorplanner of claim 1 further comprising:
   editing means whereby the macrocell group is defined, modified and positioned within the macrocell array.

5. The rule based floorplanner of claim 1 further comprising:
   display means for graphically showing a predetermined plurality of parameters affecting the theoretical rule and the measured rule.

6. The rule based floorplanner of claim 1 further comprising:
   fast global routing means for determining global route congestion; and
   a rule which utilizes global route congestion as a parameter.

7. The rule based floorplanner of claim 6 further comprising:
   congestion map display means for displaying global route congestion.

8. A method for rule based floorplanning, comprising:
   providing a plurality of predetermined macrocells which make up a predetermined macrocell array;
   compiling a macrocell physical property list comprising the physical properties for each of the macrocells;
   defining a plurality of desired connections between the macrocells within a net list;
   defining a plurality of macrocell groups among the plurality of predetermined macrocells each group comprising macrocells for which physical proximity is desired based on an analysis of the physical property list and the net list;
   manually locating the macrocell groups within the macrocell array so as to satisfy a set of predetermined design constrains which constrain later placement of the macrocells during the physical design process;
   compiling a theoretical rule for predicting routability of the macrocell array;
   compiling a measured rule for predicting routability of the macrocell array;
   computing a Burain score for the macrocell array based on the macrocell layout list, the theoretical rule, and the measured rule as applied to the macrocell groups as placed within the macrocell array; and
   modifying the structure, composition, and location of at least one macrocell group to improve the Burain score.

9. The method for rule based floorplanning of claim 8, further comprising:
   deriving a final floorplan based on the optimal group locations; and directly linking the final floorplan to at least one physical design tool which is used to create a predetermined design.

10. The method for rule based floorplanning of claim 8, further comprising:
deriving information which is unique to a predetermined design from the net list; and
computing an initial Burain score before defining macrocell groups.

11. A rule based floorplanner, comprising:
a macrocell array having a plurality of predetermined macrocells;
a net list defining a plurality of desired connections between the macrocells;
editing means whereby a plurality of macrocell groups are defined, modified and positioned within the macrocell array so as to satisfy a set of predetermined design constrains which restrain later placement of the macrocells during physical design;
a macrocell list comprising layout related properties for each of the macrocells;
a plurality of theoretical rules for predicting routability of the macrocell array based on theoretical analysis of the macrocell array and physical design constrains;
a plurality of measured rules based on past designs for predicting routability of the macrocell array;
a Burain score for the macrocell array based on the macrocell list, the theoretical rules, and the measured rules as applied to the macrocell groups as placed within the macrocell array;
congestion map display means for displaying global route congestion together with fixed routing barriers;
a final floorplan based on the optimal macrocell groups; and
linking means for directly linking the final floorplan to at least one physical design tool.

* * * * *